US005745152A

United States Patent [19]

Vincent et al.

[11] Patent Number: 5,745,152

[45] Date of Patent: Apr. 28, 1998

[54] MULTIPLE BEAM LASER SCANNER USING LASERS WITH DIFFERENT APERTURE SIZES

[75] Inventors: Kent D. Vincent, Cupertino, Calif.; James G. Bearss, Boise, Id.

[73] Assignee: Hewlett PAckard Company, Palo Alto, Calif.

[21] Appl. No.: 505,052

[22] Filed: Jul. 21, 1995

Related U.S. Application Data

[63] Continuation-in-part of Ser. No. 332,187, Oct. 31, 1994.

[51] Int. Cl.$^{6}$ .................... G01D 15/14

[52] U.S. Cl. .................... 347/238; 347/241; 372/50

[58] Field of Search .................... 347/238, 241; 372/50; 250/236

[56] References Cited

U.S. PATENT DOCUMENTS

| | | | |
|---|---|---|---|
| 4,864,326 | 9/1989 | Kawamura et al. | 347/240 |
| 5,402,436 | 3/1995 | Paoli | 347/238 |
| 5,517,328 | 5/1996 | Wilson | 347/238 |
| 5,550,668 | 8/1996 | Appel et al. | 347/233 |
| 5,574,738 | 11/1996 | Morgan | 372/50 |

*Primary Examiner*—Stuart N. Hecker

[57] ABSTRACT

Various laser patterns for vertical cavity surface emitting lasers are disclosed. The patterns utilize lasers with different size apertures. By utilizing these laser patterns, an image forming system is able to form images with improved resolution and halftoning. Apparatus and method implementations which use these laser patterns are disclosed.

20 Claims, 4 Drawing Sheets

120 124 128 122 126 130 134 132 SCAN DIRECTION 124 124 122 124 122 124 122 121 122

MULTIPLE BEAM LASER SCANNER USING LASERS WITH DIFFERENT APERTURE SIZES

CROSS REFERENCE TO RELATED APPLICATIONS

This application is related to and a continuation of copending U.S. patent application 08/332,187, entitled "METHOD AND APPARATUS FOR CONTROLLING DOT SIZE IN IMAGE FORMING APPARATUS HAVING AN ARRAY OF LASERS" and filed Oct. 31, 1994.

BACKGROUND OF THE INVENTION

1. Field of the Invention

The present invention relates to image forming devices and, more particularly, to laser-based image scanning devices having a plurality of lasers.

2. Description of the Related Art

FIG. 1 is a schematic diagram of a laser beam scanning unit. The laser beam scanning unit 2 includes a vertical cavity surface emitting laser (VCSEL) array 4 having a plurality of light emitting lasers 6 two-dimensionally disposed thereon. The intensity of the laser beams produced by the lasers 6 is discretely controlled by a control unit 8. Laser beams emitted from the lasers 6 are collimated by a collimator lens 10 to produce laser beams with a predetermined beam diameter. The laser beams then strike a facet of a rotating polygon mirror 12 and are directed through an objective lens 14 and onto an image bearing member 16. The laser beams striking the image bearing member 16 form spots 18 along scan lines 20 produced by rotating the polygon mirror 12. Further, details on the laser beam scanning unit shown in FIG. 1 are described in European Patent Publication 0544002 A1.

Conventionally, each imaged pixel on the image bearing member 16 is exposed with a laser beam from a single laser 6. Further, the apertures of all the lasers 6 within the array of lasers 4 are all designed to be the same, and each laser 6 within the array of lasers 4 has a fixed, uniform spacing from adjacent lasers. One problem with the conventional approach to image forming or printing is that halftoning is limited to a either a dot or no dot at each pixel. Conventional image forming or printing can achieve high resolution and improved halftoning by increasing the number of lasers within a square inch (2.54 centimeters) of the array of lasers.

Thus, there is a need for techniques that are able to improve resolution and halftoning without increasing the number of lasers.

SUMMARY OF THE INVENTION

Broadly speaking, the invention enables an image forming system to form images with improved resolution and halftoning by providing patterns of lasers with different size apertures within an array of lasers. The invention can be implemented as an apparatus or a method.

As an image forming apparatus, the invention comprises an image bearing member having photoresponse characteristics, an array of vertical cavity surface emitting lasers for producing light beams, and a scanning system disposed to utilize the light beams from the array of vertical cavity surface emitting lasers to produce a plurality of scan lines on the surface of the image bearing member. The lasers of the array have a plurality of different aperture sizes, including a first aperture size and a second aperture size which is smaller than the first aperture size. The lasers with the first aperture size produce spots on the image bearing member which in turn produce dots of a first size on a printing medium, and the lasers with the second aperture size produce spots on the image bearing member which in turn produce dots of a second size on the printing medium, the first size being larger then the second size.

As a method for printing dots of a controlled size on a printing medium using a laser-based image forming apparatus having an image bearing member and an array of lasers manufactured to have a plurality of different aperture sizes, the invention first receives image information indicating an image to be printed onto the printing medium, then selects a set of the lasers for printing from the lasers of the array of lasers based on the aperture size, scans the set of the lasers in accordance with the image information so as to scan the image onto the image bearing member, and finally transfers the image from the image bearing member to the printing medium.

In another method, the invention prints dots of a controlled size on a printing medium using a laser-based image forming apparatus having an image bearing member and an array of lasers manufactured to have a plurality of different aperture sizes. The lasers of the array of lasers are arranged in columns perpendicular to a scan direction over the lasers, and within each column there is at least one laser having a first aperture size and at least one aperture having a second aperture size, the first aperture size being larger than the second aperture size. The operations performed by the method include receiving image information indicating an image to be printed onto the printing medium; for each scan line produced by on of the light beams over the surface of the image bearing member, determining whether one or more of the lasers associated with a particular scan line should be driven based on dot size requested by the image information; for each scan line, driving the lasers determined so as to scan the image onto the image bearing member; and transferring the image from the image bearing member to the printing medium.

Other aspects and advantages of the invention will become apparent from the following detailed description, taken in conjunction with the accompanying drawings, illustrating by way of example the principals of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

Embodiments of the invention are discussed below with reference to FIGS. 2–5. However, those skilled in the art will readily appreciate that the detailed description given herein with respect to these figures is for explanatory purposes as the invention extends beyond these limited embodiments.

Initially, the details of the operation of the optical system used with a laser beam scanning unit are described. Thereafter, two preferred laser patterns according to the invention are described.

Figure 1:
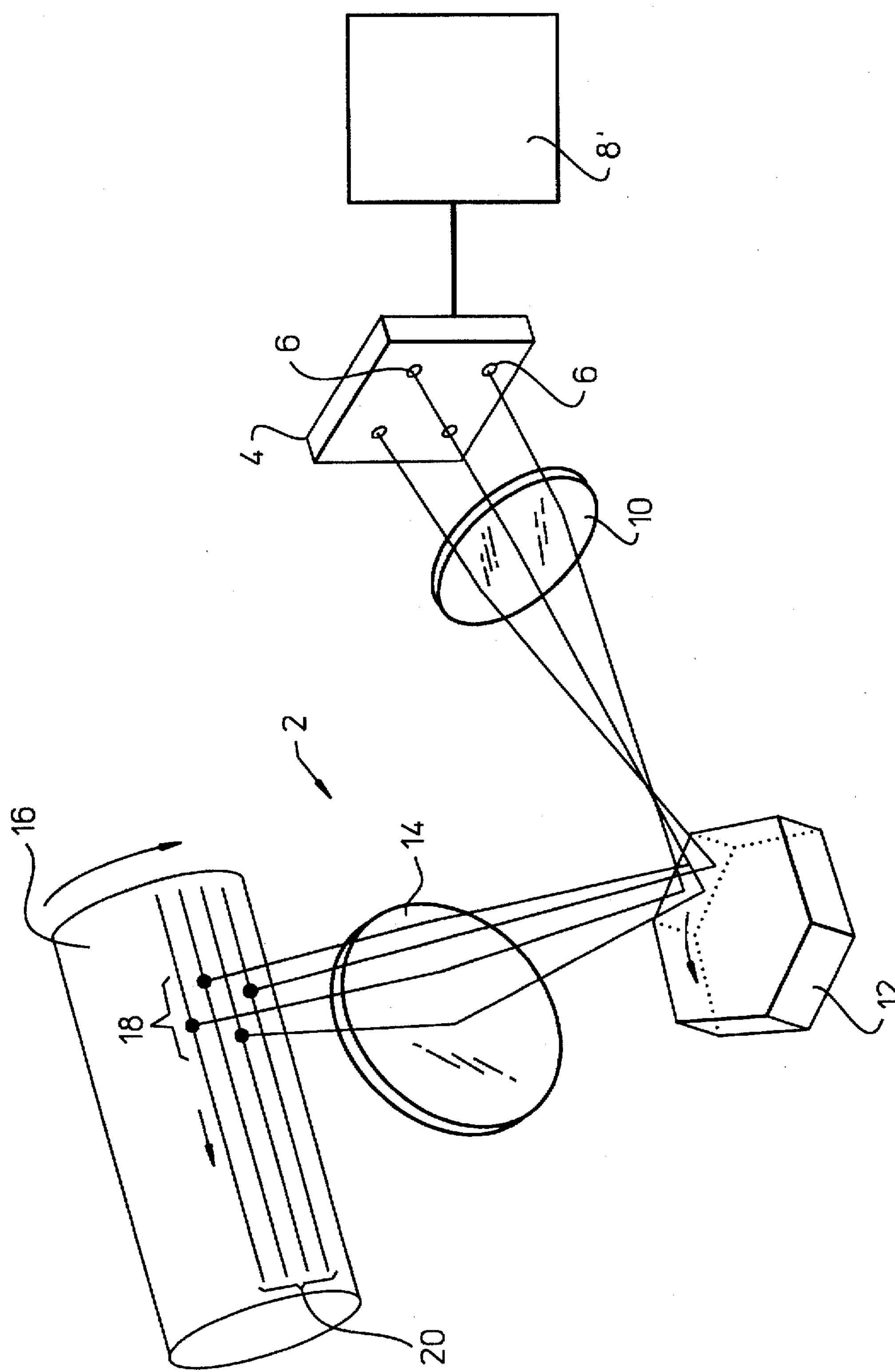
FIG. 1 is a schematic diagram of a conventional laser beam scanning apparatus.
Figure 2:
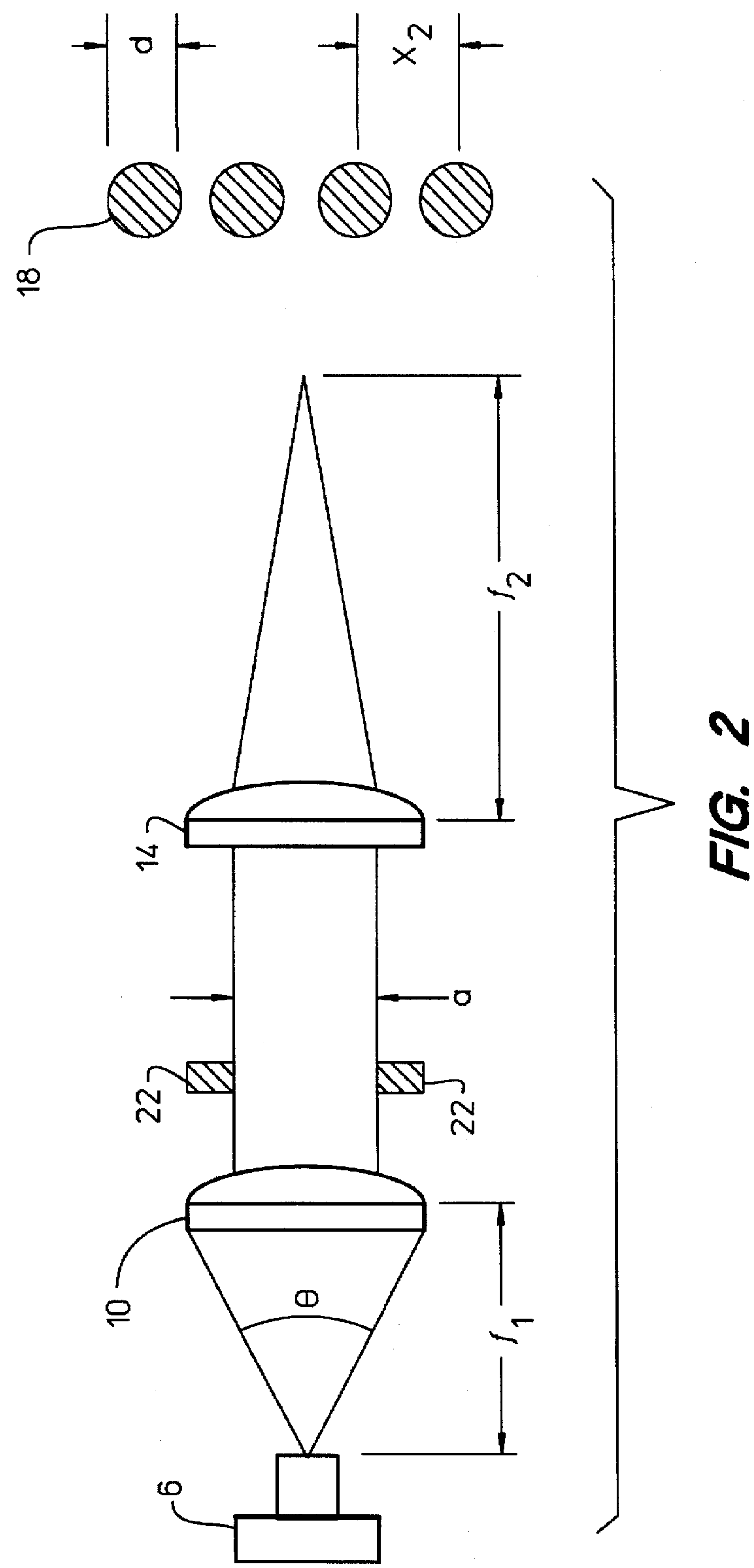
FIG. 2 is a schematic diagram of an optical system for use in a laser beam scanning apparatus.

FIG. 2 is a schematic diagram of an optical system for use in a laser beam scanning unit. The optical system includes the collimator 10, the laser 6 and the objective lens 14 which were all described with respect to FIG. 1. As shown in FIG. 2, the optical system produces a spot 18 with a diameter d on the image bearing member 16. The optical system also includes an aperture 22 with a diameter of a. The aperture of the laser 6 can be used to control the intensity of the laser beam striking the image bearing member 16. However, the use of lasers with different aperture sizes does not affect the spot size of the laser beam imaged onto the image bearing member 16. The spot size is determined by the scanner optics and is independent of the aperture of the laser 6. This relationship is depicted by the following equation, $$d=K8f_2/a \quad (1)$$

where a is the aperture stop diameter of the collimating lens 10, $f_2$ is the back focal distance of the f-2 objective lens 14, K is a constant roughly equal to 2.4 and 8 is the wavelength of the laser 6. Note that from equation (1) the aperture stop diameter α effects the diameter d of the spot, but the aperture of the laser does not effect the diameter d of the spot.

The light energy coupled through the collimator lens 10 to an aperture stop is dependent on the dispersive angle N of the laser 6 and the diameter of the aperture of the laser 6. In general, as the diameter of the aperture of the laser 6 is decreased, the energy emitted by the laser 6 decreases with aperture area and less light is coupled through the optics as the dispersive angle N increases with decreasing aperture diameter. Thus, two lasers having different aperture diameters, but otherwise identical structures, powered by a common voltage into a common set of optics, will produce focused laser beams of identical spot size but different intensities. Due to the photoresponse characteristics of the image bearing member 16 (e.g., photoconductor), these spots of different intensities will in turn produce print dots with different diameters. Also, the imaged pitch $x_2$ resulting from an array of lasers having a pitch $x_1$ is related to the magnification of the optics. Specifically, this relationship is given by the following equation, $$x_2=(f_2/f_1)x_1$$

where $f_1$ is the focal length of the collimator lens 10.

Figure 3:
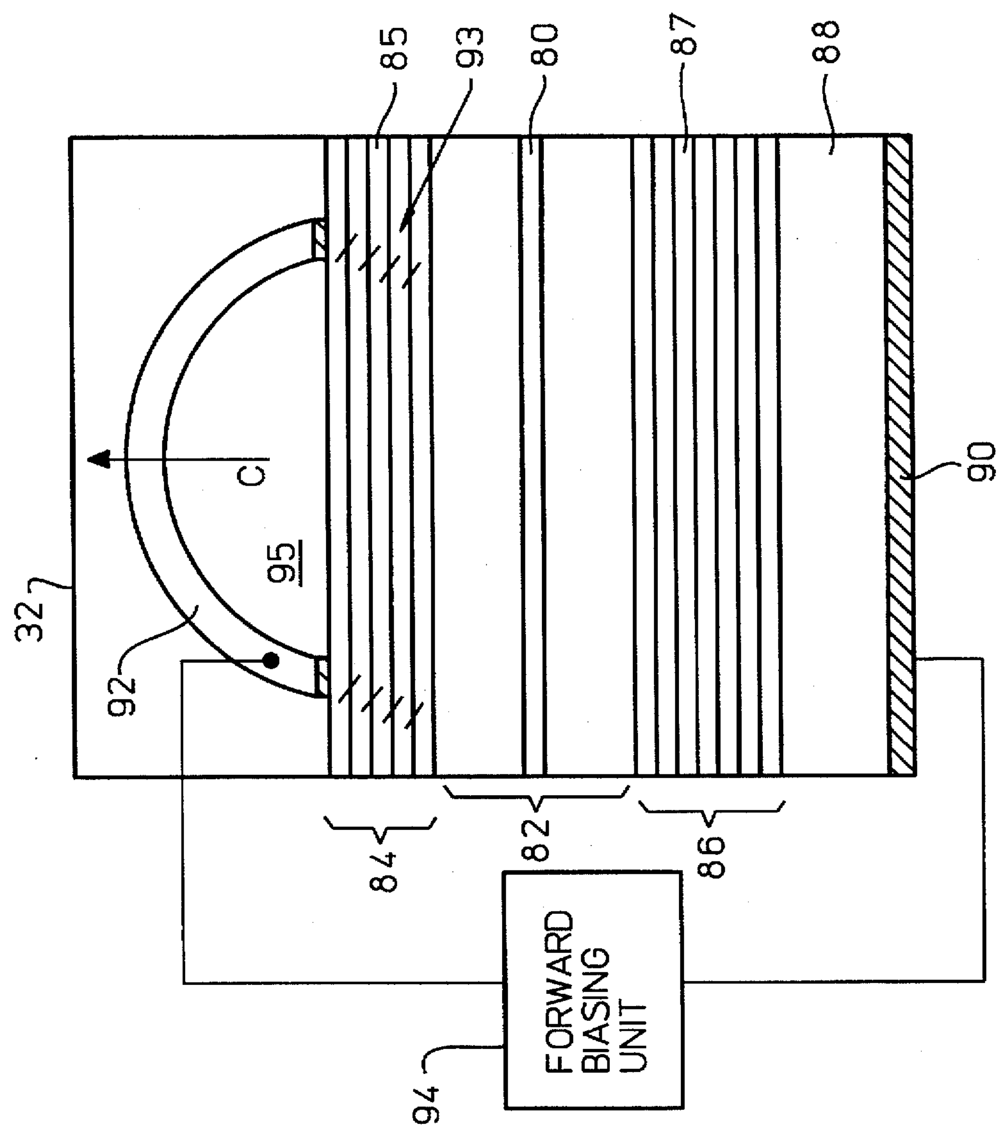
FIG. 3 is a diagram of a thin film construction of a vertical cavity surface emitting laser.

FIG. 3 is a diagram of a cross-section of a thin film construction of a vertical cavity surface emitting laser (VCSEL) 32. The vertical cavity surface emitting laser 32 is designed to emit light at a wavelength of 8/m, where mode m is an integer. The laser 32 comprises an active (photon generation) region 80 clad on each side by Bragg reflectors 84 and 86. The Bragg reflectors 84 and 86 consist of layers 85 and 87 of p-doped and n-doped material, respectively, to form a P-N junction across the active region 80. The Bragg reflectors 84 and 86 are a periodic structure of thin semiconductor or dielectric films with alternating refractive indices. Each of the layers 85 and 87 have an optical thickness of 8/4. The active region 80 is deposited central to an optical cavity 82 having an optical thickness 8. The cavity 82 is constructed from a relatively high or low refractive index material compared to the abutting layers of Bragg reflectors 84 and 86.

Light generated by the active region 80 is reflected by the various layers 85 and 87 of the Bragg reflectors 84 and 86 so that most of the light is reflected back into the cavity 82. Wave interference within the layers reduces the light to standing waves of wavelength 8/m. By designating Bragg reflectors 84 and 86 to be somewhat less than totally reflective, coherent light C of wavelength 8/m is emitted perpendicular to the plane of the optical layers. By proper selection of layer materials and thicknesses, the emission of the laser can be reduced to a single longitudinal mode.

The entire structure for the laser 32 is deposited on a substrate 88. Metal electrodes 90 and 92 are also deposited over the substrate 88 and the Bragg reflector 84. Electrodes 90 and 92 are used to electrically stimulate the laser.

The laser 32, shown in FIG. 3, is activated by forward biasing the electrode 92 with respect to electrode 90. This forward biasing is achieved by a forward biasing unit 92 depicted in FIG. 3. Typically, the forward biasing unit 92 is a DC voltage source with its positive potential connected to electrode 92 and its negative potential connected to electrode 90.

An exemplary VCSEL structure consists of 30.5 pairs of alternating AlGaAs and AlAs layers epitaxially grown by molecular beam epitaxy on a N-type GaAs wafer to form the inner bragg reflector 86. The active layer 80 is next deposited and comprises three to five quantum wells of either AlGaAs or GaAs. Next, 20 pairs of AlGaAs and AlAs layers to form the outer Bragg reflector 84. The alternating AlGaAs and AlAs layers are constructed in a graded short period super lattice to reduce electrical resistance and band offset across the layer interfaces, as is well known in the art. A region 93 of the Bragg reflector 84 directly below the metalized portion of the electrode 92 is proton bombarded to confine current and likewise photon generation to the region of the aperture of the laser 32. The electrode 92 is a ring p-type contact metalized electrode which is deposited on the outer Bragg reflector 84, and the electrode 90 is an n-type contact metalized electrode placed on the back of the n-type GaAs substrate 88.

There are many other ways to construct a vertical cavity surface emitting laser, thus the VCSELs used in the invention are not limited to using the particular structure shown in FIG. 3. Some additional approaches are described in a commonly owned, copending U.S. patent application 08/332,231, entitled "INTEGRATION OF PHOTODIODE WITH SURFACE EMITTING LASER," filed Oct. 31, 1994, and hereby incorporated by reference.

The invention concerns patterns or arrangements of lasers having differing diameters that are useful for providing grayscale (halftone) and resolution enhancement. Although numerous embodiments of the general inventive concept are possible, two preferred embodiments are described below.

Figure 4:
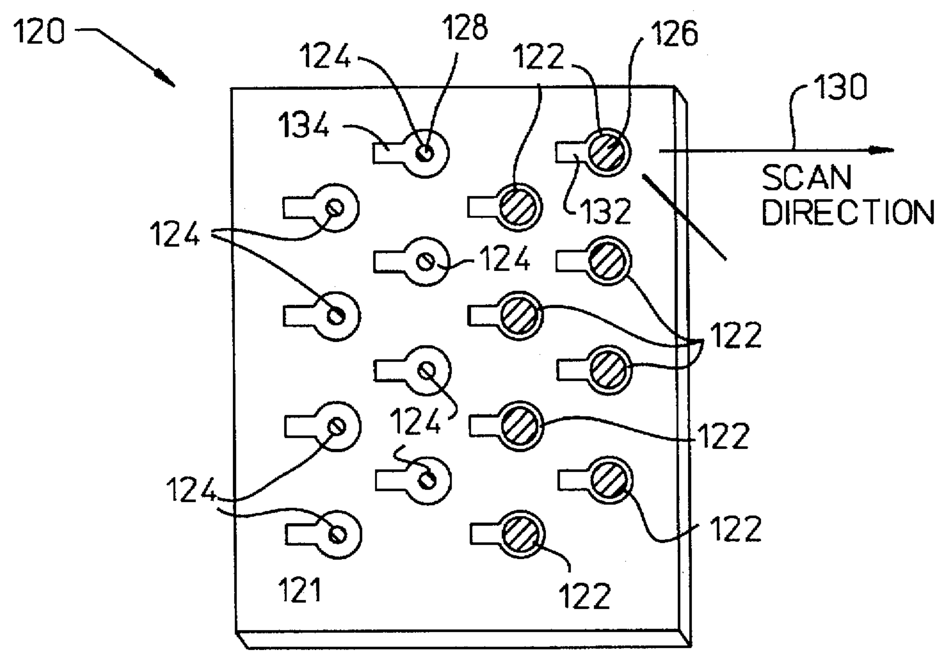
FIG. 4 is a diagram of a first laser pattern according to a first embodiment of the invention.

A first embodiment of a laser pattern according to the invention is illustrated in FIG. 4. Specifically, FIG. 4 illustrates a staggered VCSEL array 120 fabricated on a substrate 121. The staggered array 120 employs a repeated pattern of first and second lasers (i.e., laser diodes) 122 and 124, respectfully, on each scan line. The first and second lasers 122 and 124 have apertures 126 and 128, respectively. The apertures 126 and 128 are different in diameter. For example, the aperture 126 of the first laser 122 (the larger aperture) could be 15 μm and the aperture 128 of the second laser 124 (the smaller aperture) could be 10 μm. A scan direction 130 is also shown in FIG. 4. Hence, the VCSEL array 120 has multiple lasers 122 and 124 for each pixel or spot of a scan line. For the example shown in FIG. 4, there is a pair of lasers 122 and 124 for each scan line.

In operation, a given pixel or spot within a scan line exposure of the photoconductor may be illuminated by either or both (in sequence) of the two lasers 122 and 124 to produce multiple gray levels per pixel. Consequently, the invention is able to achieve halftoning by providing multiple lasers per scan line, each of the multiple lasers available to expose each pixel. Lasers 122 and 124 are preferably separated physically along the scan line by an integer number of projected pixel columns to simplify the clocking of laser pulses to properly position each imaged pixel.

The staggering of the alternating columns of the lasers shown in FIG. 4 is desirable for various reasons. First, without staggering, it is difficult to place the VCSELs close enough together to produce abutting light spots because the apertures 126 and 128 will be smaller than the outer boundary of the VCSEL which is set by electrodes 132 and 134, respectively. Second, staggering increases the spatial separation of the VCSELs which substantially decreases crosstalk and interference between adjacent VCSELs. Hence, by aligning the VCSELs in a staggered pattern of columns, the VCSELs can be spatially separated and the light beams impinging on a photoconductor appear as an abutting array of light spots that sweep the width of the photoconductor.

In the embodiment shown in FIG. 4, the staggered VCSEL array 120 produces a scan of eight adjacent pixel lines, each pixel having four addressable gray levels. The four addressable gray levels are: no exposure, exposure by laser 122, exposure by laser 124, and exposure by both lasers 122 and 124 in sequence. Here, each laser is powered at either full on or full off. However, even a greater number of gray levels per pixel can be realized by further controlling laser intensity of the individual VCSELs as described in copending and commonly owned U.S. patent application 08/332,187, entitled "METHOD AND APPARATUS FOR CONTROLLING DOT SIZE IN IMAGE FORMING APPARATUS HAVING AN ARRAY OF LASERS," filed Oct. 31, 1994, and hereby incorporated by reference.

Figure 5:
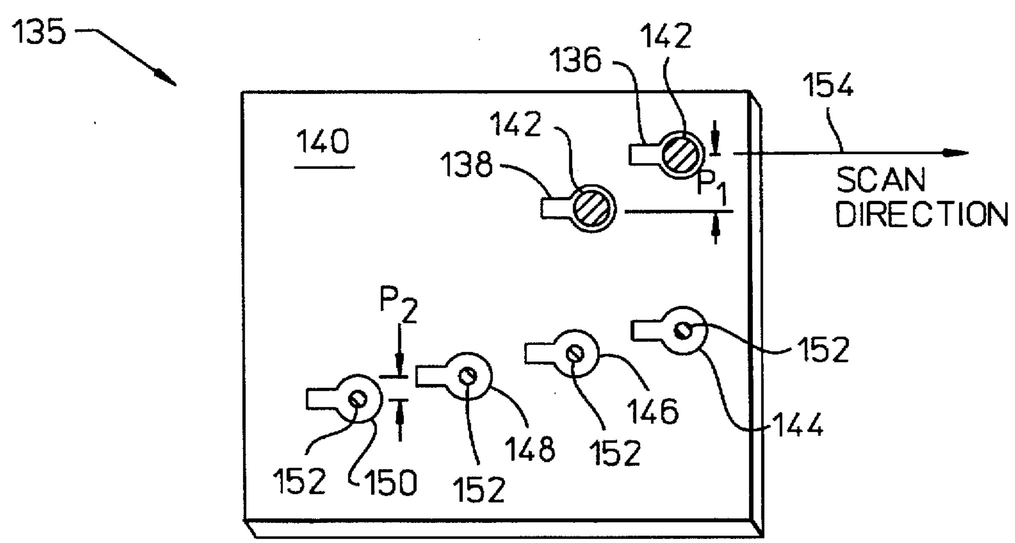
FIG. 5 is a diagram of a second laser pattern according to a second embodiment of the invention.

A second embodiment of a laser pattern according to the invention is illustrated in FIG. 5. In this configuration, a VCSEL array 134 is patterned on a substrate to allow selectable or combinable resolutions. In this case, two lasers 136 and 138 are formed on a common substrate 140 and separated by a first selected pitch p1. The two lasers 136 and 138 have aperture 142 of the same diameter. Further, on the common substrate 140, lasers 144–150 are sequentially separated by a second selected pitch p2. In this particular embodiment, the second selected pitch p2 is half the pitch of the first selected pitch p1. The lasers 144–150 also have an aperture 152 that is half the diameter of the aperture 142 of lasers 136 and 138. A scan direction 154 is also shown in FIG. 5.

In this second embodiment, these are multiple sets of lasers with each set having a different aperture size. If regular resolution is sufficient for a section of a document, then the set of lasers including lasers 136 and 138 is used. On the other hand, if higher resolution is desired, then the set of lasers including lasers 144–150 is used. Hence, in this embodiment, there are two possible sets of lasers which can be used to scan or print an image.

This pattern or arrangement of the VCSEL array 134 allows lasers 144–150 to be addressed at twice the resolution that lasers 136 and 138 can be addressed. With common optics, although all the light exposed pixels produced on the photoconductor will have the same size, the spot images produced by lasers 144–150 will be of lower intensity than the spot images produced by lasers 136 and 138. However, when the image is exposed on the photoconductor (transferred from the photoconductor to printing medium), the lower intensity laser spot will produce a smaller diameter discharge area than the higher intensity laser spot by virtue of the threshold photoresponse characteristic of the photoconductor. With careful matching of photoconductor, laser aperture diameter and laser driving voltage, the printed dots produced through lasers 144–150 can be made half the diameter of those produced by lasers 136 and 138.

A primary advantage of such an arrangement of lasers is the ability to reduce data transfer and raster image processing time as well as complexity. When high resolution is not needed, the lasers 136 and 138 are used because they can scan or print faster. Alternatively, when high resolution is needed, the lasers 144–150 are used because they can scan or print with greater resolution then do lasers 136 and 138. The switching back and forth between these sets of lasers can be done within a document. As a result, in the case of printing a document, an optimum print resolution can be selected for each segment of the document where a single resolution would, otherwise, be dictated for the entire document. For example, beyond 1200 dots per inch, the eye does not perceive a significant increase in text quality. Full grayscale images, however, are best produced at 2400 dots per inch in binary pixel mode. The second embodiment would allow each segment within a document to be printed at its process speed and quality optimized resolution. Consider, for example, a given page of a document containing both text and a digitized picture to be scanned or printed, the text could be printed in regular resolution and the digitized picture appearing on a portion of the page could be printed with higher resolution. Under normal circumstances, in this second embodiment, a given pixel of a scan line will be imaged by one laser. However, those in the art will recognize that numerous other embodiments are possible. The first and second embodiments could even be combined so that resolution would first be used to select a set of lasers and then the multiple lasers could be used to provide discrete gray levels.

In either embodiment, a pattern of laser diodes is scanned across a photoconductor surface. Due to the staggering of the lasers, the pulsing sequence for a given laser must be controlled with the movement of the photoconductor to assure the correct placement of pixels on the photoconductor. The data stream driving each laser must be managed so that the columns of pixels produced in the scan are correctly aligned and contain the correct pixel values for the image being printed. Columnar alignment is easily achieved by simply separating the laser diode columns by integer pixel spacings. Common electronic delay lines can be used to place each pixel that separate its column from the furthest upstream column in the pattern. The pattern of laser diodes is thus fired at a clock frequency equal to the pixel rate of the scan. Those skilled in the art are able to modify conventional laser control so as to facilitate the laser patterns of the invention The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

We claim:

1. In an image forming apparatus having an array of vertical cavity surface emitting lasers, wherein the improvement comprising said array including lasers having a first aperture size and lasers having a second aperture size, the first aperture size being different than the second aperture size, and wherein said image forming apparatus is capable of producing a plurality of dot sizes on a printing medium.

2. In an image forming apparatus as recited in claim 1, wherein the improvement is further characterized in that said image forming apparatus prints or scans using multiple dot sizes.

3. In an image forming apparatus as recited in claim 1, wherein the improvement is further characterized in that a dot size greater than that produced by one of the lasers individually is obtained by using two or more of the lasers sequentially.

4. An image forming apparatus, comprising:

an image bearing member for forming an image thereon, said image bearing member having photoresponse characteristics;

an array of vertical cavity surface emitting lasers for producing light beams, each of the lasers producing a light beam, the lasers being manufactured to have a plurality of different aperture sizes, the plurality of aperture sizes including a first aperture size and a second aperture size, the first aperture size being larger than the second aperture size; and a scanning system disposed to utilize the light beams from said array of vertical cavity surface emitting lasers to produce a plurality of scan lines on the surface of said image bearing member, wherein the lasers with the first aperture size produce spots on said image bearing member which in turn produce dots of a first size on a printing medium, and the lasers with the second aperture size produce spots on said image bearing member which in turn produce dots of a second size on the printing medium, the first size being larger then the second size.

5. An image forming apparatus as recited in claim 4, wherein the lasers of said array of lasers are arranged in columns perpendicular to a scan direction, each laser in a column corresponds to one of the scan lines, and adjacent columns of the lasers are staggered.

6. An imaging forming apparatus as recited in claim 5, wherein said array of lasers are manufactured such that the lasers in adjacent columns having the first aperture size are staggered by a predetermined pitch, and the lasers in adjacent columns having the second aperture size are staggered by a pitch smaller than the predetermined pitch.

7. An imaging forming apparatus as recited in claim 4, wherein the lasers are arranged within said array to allow selectable printing resolution.

8. An image forming apparatus as recited in claim 4, wherein for each of a plurality of the scan lines used by said scanning system, there is associated at least one of the lasers having the first aperture size and at least one of the lasers having the second aperture size.

9. An image forming apparatus as recited in claim 4, wherein the lasers of said array of lasers are arrange in columns perpendicular to a scan direction over the scan lines, each of the columns includes a first set of the lasers with the first aperture size for providing a first resolution and a second set of the lasers with the second aperture size for providing a second resolution.

10. An image forming apparatus as recited in claim 9, wherein said image forming apparatus further comprises a controller for selecting the first set of the lasers when the image printed to the printing medium is to be printed using the first resolution, and selecting the second set of the lasers when the image printed to the printing medium is to be printed using the second resolution.

11. An imaging forming apparatus as recited in claim 10, wherein the image to be printed is a document, and wherein said controller selects between the first and second sets of lasers within the document.

12. A method for printing dots of a controlled size on a printing medium using a laser-based image forming apparatus having an image bearing member and an array of lasers, the lasers of the array of lasers being manufactured to have a plurality of different aperture sizes, said method comprising:

(a) receiving image information indicating an image to be printed onto the printing medium;

(b) selecting a set of the lasers for printing from the lasers of the array of lasers based on the aperture size;

(c) scanning the set of the lasers in accordance with the image information so as to scan the image onto the image bearing member; and (d) transferring the image from the image bearing member to the printing medium.

13. A method as recited in claim 12, wherein light beams from the lasers produce a plurality of scan lines over the surface of the image bearing member, and the lasers of the array of lasers are arranged in columns perpendicular to a scan direction over the lasers.

14. A method as recited in claim 13, wherein for each of a plurality of the scan lines, there is associated at least one of the lasers having a first aperture size and at least one of the lasers having a second aperture size, and wherein said selecting (b) chooses the set of lasers based on resolution or grayscale desired for the printed image.

15. A method as recited in claim 14, wherein when a pixel within the image is to be printed with a greater grayscale than obtainable by the individual lasers on the associated scan line, said scanning further drives a plurality of the lasers on the associated scan line in succession.

16. A method as recited in claim 12, wherein said selecting (b) selects the set of the lasers within a document, whereby printing with different resolution can occur within the document.

17. A method as recited in claim 12, wherein said selecting (b) selects the set of the lasers within a page of a document, whereby printing with different resolution can occur within the page of the document.

18. A method for printing dots of a controlled size on a printing medium using a laser-based image forming apparatus having an image bearing member and an array of lasers, the lasers of the array of lasers being manufactured to have a plurality of different aperture sizes, light beams from the lasers produce a plurality of scan lines over the surface of the image bearing member, and the lasers of the array of lasers are arranged in columns perpendicular to a scan direction over the lasers, and within each column there is at least one laser having a first aperture size and at least one aperture having a second aperture size, the first aperture size being larger than the second aperture size, said method comprising:

(a) receiving image information indicating an image to be printed onto the printing medium;

(b) for each scan line, determining whether one or more of the lasers associated with a particular scan line should be driven based on dot size requested by the image information;

(c) for each scan line, driving the lasers determined in (b) so as to scan the image onto the image bearing member; and (d) transferring the image from the image bearing member to the printing medium.

19. A method as recited in claim 18, wherein said method prints dots with different grayscale by said driving (b) which sequentially drives a plurality of the lasers to produce a given pixel on a given scan line.

20. A method as recited in claim 18, wherein when the image information requests a dot size or grayscale greater than that individually produced by one of the lasers, said determining (b) determines that two or more of the lasers should be driven sequentially in (c).

* * * * *